(12) United States Patent
Matuschek et al.

(10) Patent No.: US 6,256,434 B1
(45) Date of Patent: Jul. 3, 2001

(54) METHOD AND DIELECTRIC AND/OR SEMICONDUCTOR DEVICE FOR INFLUENCING THE DISPERSION OF ELECTROMAGNETIC RADIATION

(75) Inventors: Nicolai Matuschek, Lottstetten (DE); Dirk H. Sutter, Zurich (CH); Lukas Gallmann, Zurich (CH); Guenter Steinmeyer, Zurich (CH); Ursula Keller, Zurich (CH)

(73) Assignee: Time-Bandwidth Products AG, Zurich (CH)

( * ) Notice: Subject to any disclaimer, the term of this patent is extended or adjusted under 35 U.S.C. 154(b) by 0 days.

(21) Appl. No.: 09/352,248

(22) Filed: Jul. 13, 1999

(51) Int. Cl.[7] .................................................. G02B 6/34

(52) U.S. Cl. ................................ 385/37; 385/15; 385/31; 359/584

(58) Field of Search .................................. 385/15, 31, 37, 385/27, 129, 130, 131; 359/580, 584, 589

(56) References Cited

U.S. PATENT DOCUMENTS

| 5,230,029 | 7/1993 | Mendenhall et al. | 385/27 |
| 5,734,503 | 3/1998 | Szipocs et al. | 359/584 |
| 5,982,963 | 11/1999 | Feng et al. | 385/37 |
| 6,081,379 | 6/2000 | Austin et al. | 359/584 |

OTHER PUBLICATIONS

R. Szipöcs, K. Ferencz, Ch. Spielmann, and F. Krausz,*Opt. Lett.* 19, 201, (1994).
G. Tempea, F. Krausz, Ch. Spielmann, and K. Ferencz,*IEEE JSTQE* 4, 193, (1998).
F. X. Kärtner, N. Matuschek, T. Schibli, U. Keller, H. Haus, C. Heine, R. Morf, V. Scheuer, M. Tilsch and T. Tschudi, *Opt. Lett.* 22, 831 (1997).
R. Szipöcs, and A. Kohazi–Kis,*Apl. Phys. B* 65, 115 (1997).
L. Xu, Ch. Spielmann, F. Krausz, and R. Szipöocs, *Opt. Lett.* 21, 1259 (1996).
E. J. Mayer, J. Möbius, A. Euteneur, W. W. Rühle, and R. Szipöcs, *Opt. Lett.* 22, 528 (1997).
A. Baltuska, Z. Wei, M. S. Pshenichnikov, D. A. Wiersma, and R. Szipöcs, *Appl. Phys. B* 65, 175 (1997).
M. Nisoli, S. De Silvestri, O. Svelto, R. Szipöcs, K. Ferenz, Ch. Spielmann, S. Sartania, and F. Krausz, *Opt. Lett.* 22, 522 (1977).
N. Matuschek, F. X. Kätner, and U. Keller, *Conference on Lasers and Electrooptics (CLEO '98)*, San Francisco, CA, May 3–8, paper CThC6 (1998).
N. Matuschek, F. X. Kärtner, and U. Keller, *IEEE J. Sel. Topics Quantum Electron.* 4, 197 (1998).
N. Matuschek, F. X. Kärtner, and U. Keller,*IEEE J. Quantum Electron.* 35, 129 (1999).

(List continued on next page.)

Primary Examiner—John D. Lee
Assistant Examiner—Jennifer Doan
(74) Attorney, Agent, or Firm—Oppedahl & Larson LLP

(57) ABSTRACT

The dielectric and/or semiconductor device influences the dispersion of electromagnetic radiation within a given spectral range. It comprises a substrate being essentially transparent to said electromagnetic radiation. The substrate has a first surface for incoupling said electromagnetic radiation into said substrate, and a second surface. The device further comprises a reflective multilayer structure on said second surface, said multilayer structure providing a controlled dispersion characteristic upon reflection of said electromagnetic radiation, e.g., a chirped mirror. The device is arranged in such a way that there is essentially no interference of electromagnetic radiation propagating in the direction of said multilayer structure and electromagnetic radiation reflected by said multilayer structure. An antireflection coating may be provided on the first surface of the substrate. With this device, oscillations in the group delay dispersion can almost completely be avoided.

16 Claims, 13 Drawing Sheets

OTHER PUBLICATIONS

R. Paschotta, G. J. Spühler, D. H. Sutter, N. Matuschek, U. Keller, M. Moser, R. Hövel, V. Scheuer, G. Angelow and T. Tschudi, to be submitted to *Appl. Phys. Lett.,* (1999).

V. Scheuer M. Tilsch, T. Tschudi, *SPIE Conf. Proc.* 2253, 445 (1994).

M. Tilsch, V. Scheuer, T. Tschudi, *SPIE Conf. Proc.* 2253, 414 (1994).

I. D. Jung, F. X. Kärnter, N. Matuschek, D. H. Sutter, F. Morier–Genoud, G. Zhang, U. Keller, V. Scheuer, M. Tilsch, and T. Tschudi, *Opt. Lett.* 22, 1009 (1997).

U. Morgner, F. X. Kärtner, S. H. Cho, A. Haus, J. G. Fujimoto, E. P. Ippen, V. Scheuer, G. Angelow, and T. Tschudi, *Opt. Lett.* 24, 411 (1999).

D. H. Sutter, G. Steinmeyer, L. Gallmann, N. Matuschek, F. F. Morier–Genoud, U. Keller, V. Scheuer, G. Angelow, and T. Tschudi, *Opt. Lett.* 24, accepted for publication (1999).

D. H. Sutter, I. D. Jung, N. Matuschek, F. Morier–Genoud, F. X. Kärtner, and U. Keller, *Conference on Lasers and Electrooptics (CLEO '98),* San Francisco, CA, May 3–8, paper CThC5 (1998).

N. Matuschek, I. D. Jung, D. H. Sutter, F. X. Kärtner, U. Keller, V. Scheuer, M. Tilsch, and T. Tschudi, *Conference on Ultrafast Optics,* Monterey, CA, Aug. 4–7, paper TA–5 (1997).

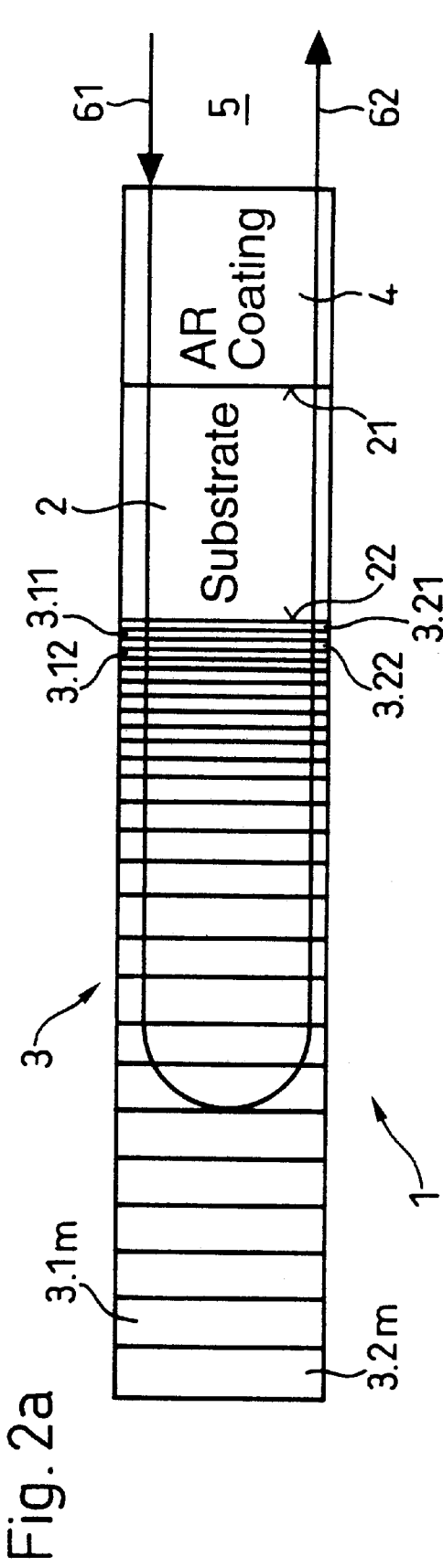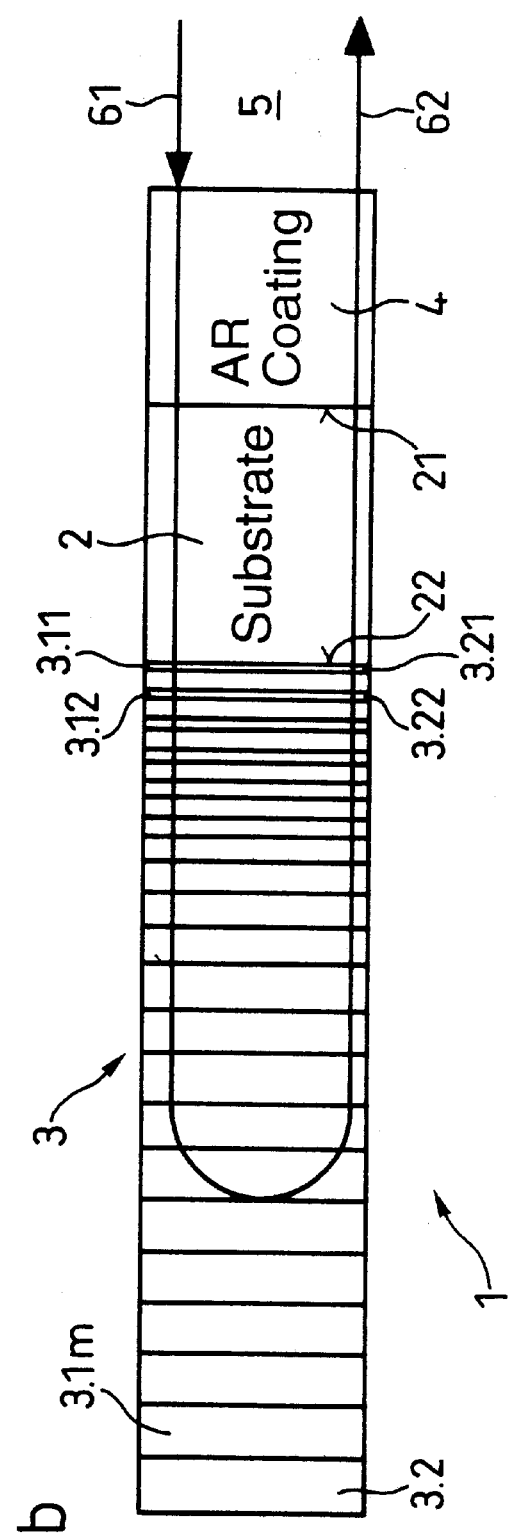

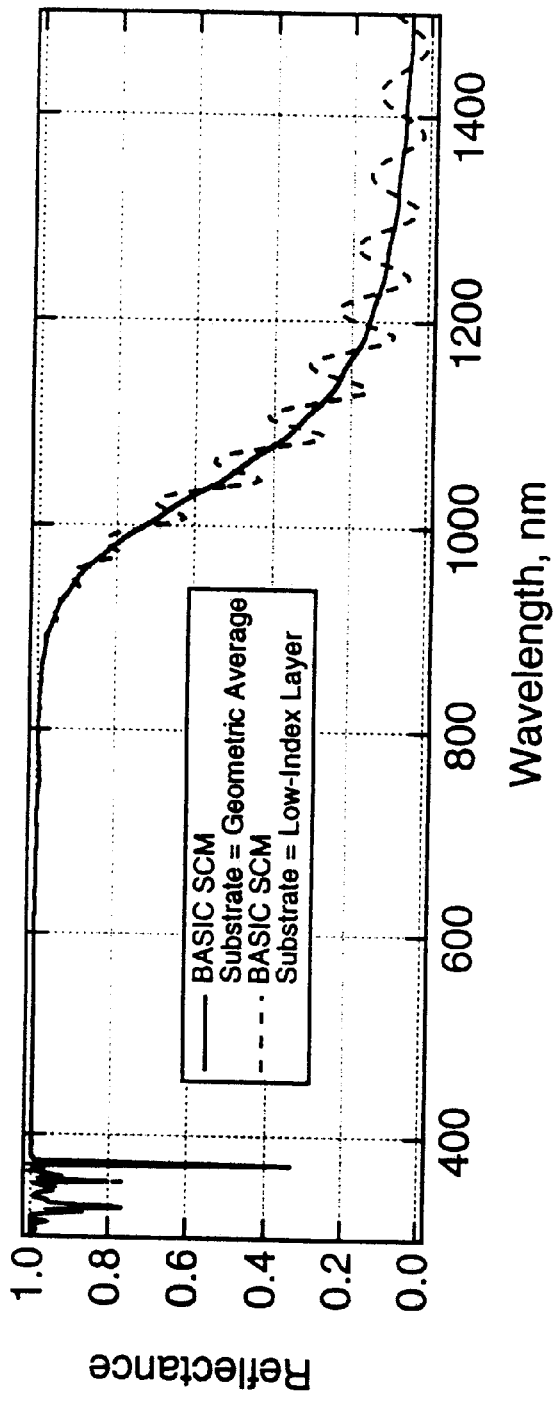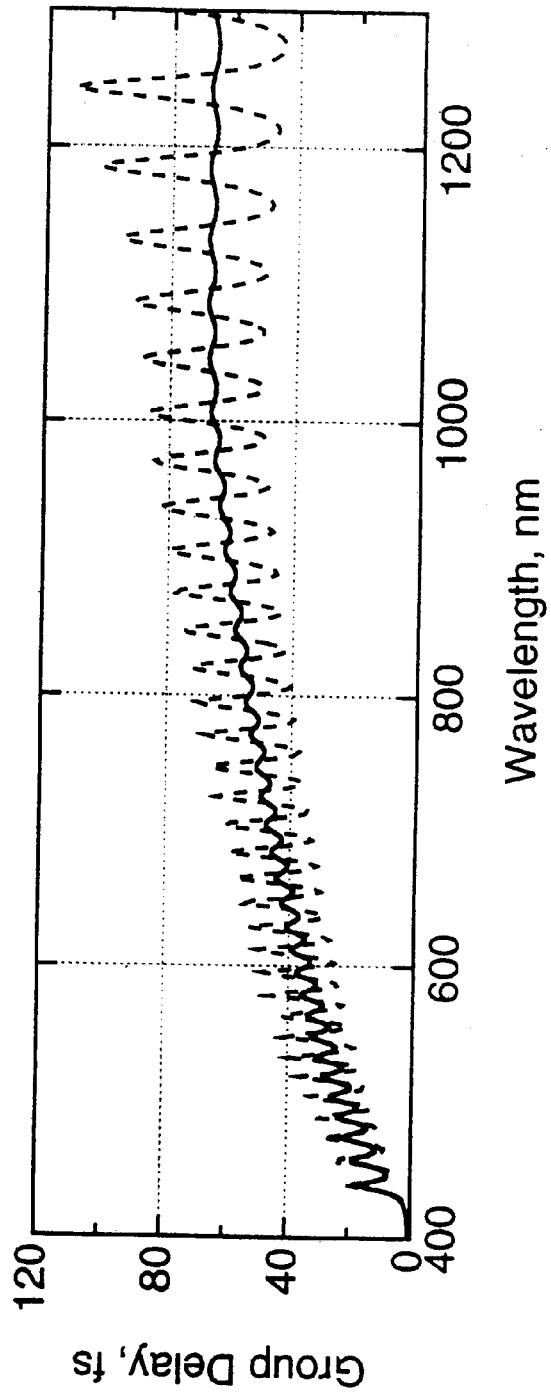

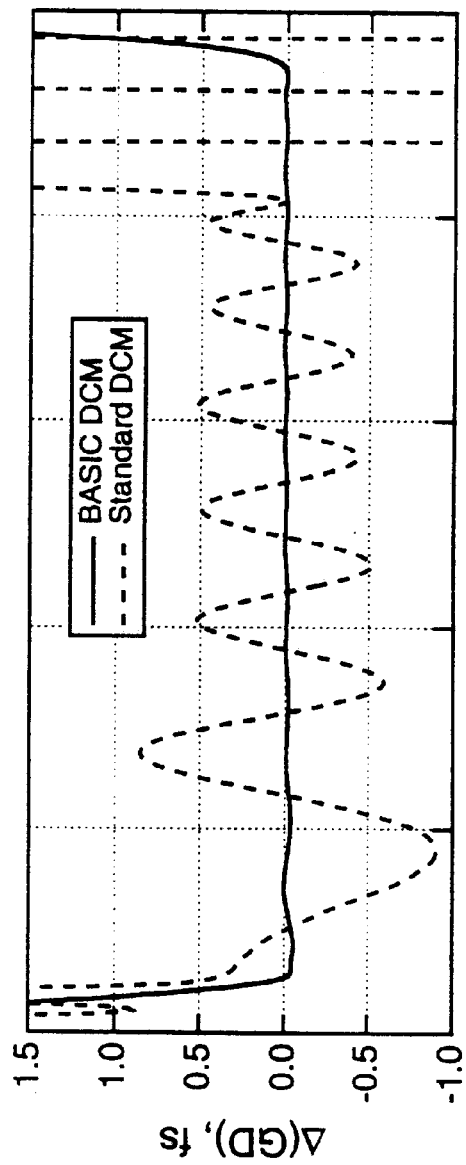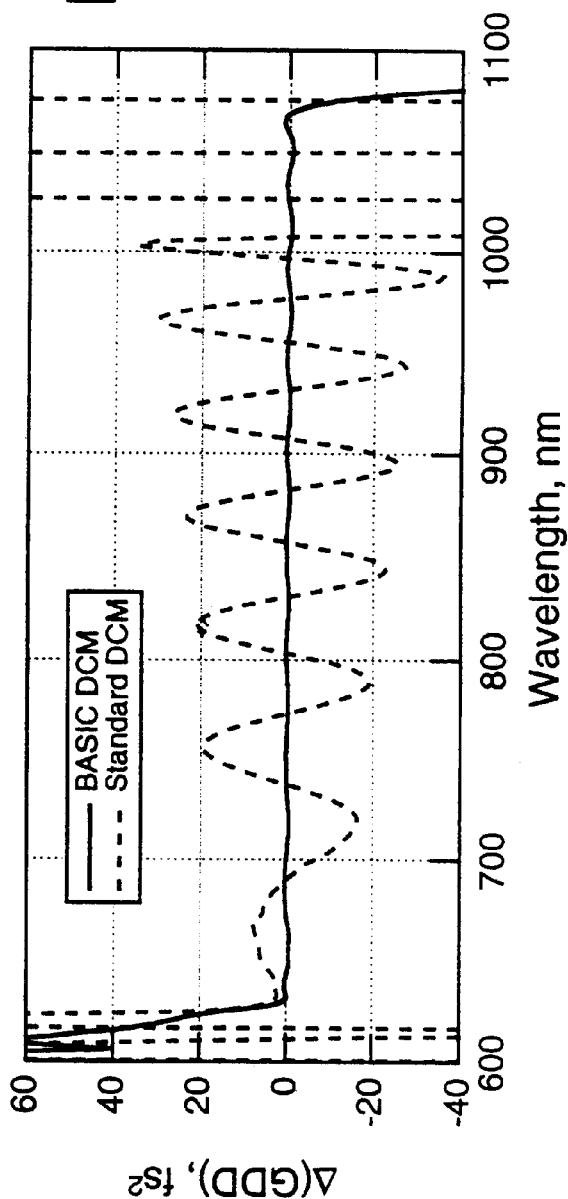

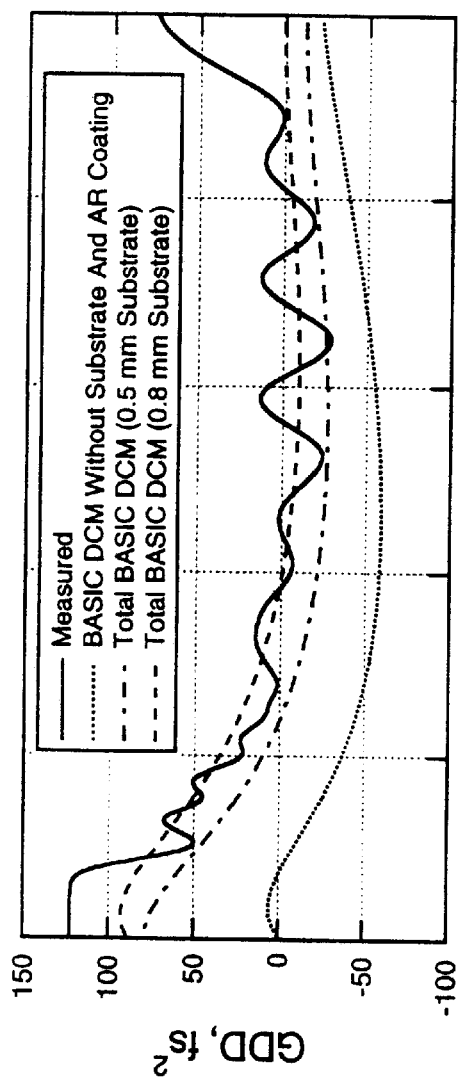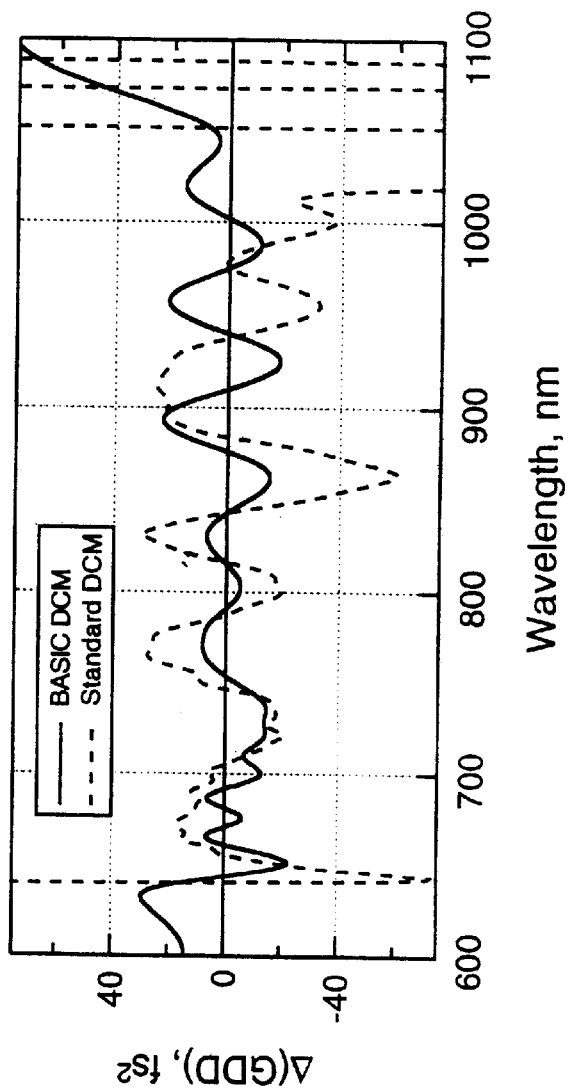

METHOD AND DIELECTRIC AND/OR SEMICONDUCTOR DEVICE FOR INFLUENCING THE DISPERSION OF ELECTROMAGNETIC RADIATION

FIELD OF THE INVENTION

The invention relates to the field of reflective dielectric and/or semiconductor devices, and more particularly to broadband reflective dielectric and/or semiconductor devices used as mirrors in laser resonators.

BACKGROUND OF THE INVENTION

Chirped minors have been established in various set-ups for the generation of ultrashort laser pulses (see, e.g., U.S. Pat. No. 5,734,503 (Szipöcs et al.); R. Szipöcs, K. Ferencz, Ch. Spielmann, and F. Krausz, *Opt. Lett.* 19, 201, (1994); G. Tempea, F. Krausz, Ch. Spielmann, and K. Ferencz, *IEEE JSTQE* 4, 193, (1997); F. X. Kärtner, N. Matuschek, T. Schibli, U. Keller, H. Haus, C. Heine, R. Morf, V. Scheuer, M. Tilsch and T. Tschudi, *Opt. Lett.* 22, 831 (1997)). Their high-reflectance bandwidth is broader compared to standard dielectric quarter-wave Bragg mirrors and their dispersion can be custom-tailored such that the dispersion of other elements in the laser is compensated for. Thus, chirped mirrors are very useful and compact devices for broadband dispersion control in systems like modelocked laser oscillators, laser amplifiers, parametric oscillators and amplifiers, and dispersive delay lines.

The basic idea behind a chirped mirror is relatively simple: layers with increasing thicknesses (e.g., quarter-wave layers with a gradually increasing Bragg wavelength) are stacked such that longer wavelengths penetrate deeper into the mirror structure, producing a negative group delay dispersion (GDD). The whole principle can also be inverted by decreasing the layer thicknesses, which results in chirped mirrors with a positive GDD.

Besides all advantages, chirped mirrors have one major disadvantage, as far as has been demonstrated. The designed group delay (GD) and GDD generally show unwanted oscillations around their desired target functions. One finds that, unfortunately, the amplitude of the oscillations dramatically increases with an increasing bandwidth. Typically, for standard chirped mirrors, these oscillations are reduced as much as possible by more or less sophisticated numerical optimization techniques (R. Szipöcs, K. Ferencz, Ch. Spielmann, and F. Krausz, *Opt. Lett.* 19, 201, (1994); G. Tempea, F. Krausz, Ch. Spielmann, and K. Ferencz, *IEEE JSTQE* 4, 193, (1997); R. Szipöcs, and A. Kohazi-Kis, *Apl. Phys.* B 65, 115 (1997)). Up to a certain limit, this approach has been successfully applied on chirped mirrors used in various types of lasers (see, e.g., L. Xu, Ch. Spielmann, F. Krausz, and R. Szipöcs, *Opt. Lett.* 21, 1259 (1996); E. J. Mayer, J. Möbius, A. Euteneuer, W. W. Rühle, and R. Szipöcs, *Opt. Lett.* 22, 528 (1997); A. Baltuska, Z. Wei, M. S. Pshenichnikov, D. A. Wiersma, and R. Szipöcs, *Appl. Phys.* B 65, 175 (1997); M. Nisoli, S. De Silvestri, O. Svelto, R. Szipöcs, K. Férenz, Ch. Spielmann, S. Sartania, and F. Krausz, *Opt. Lett.* 22, 522 (1997)). However, designing by computer optimization leads to no deeper insight into the physics of a chirped mirror and the related design problems. In particular, the physical origin for the resulting oscillations remains unclear. Additionally, mirror structures obtained by pure computer optimization might be plagued by internal resonances (R. Szipöcs and A. Kohazi-Kis, *Apl. Phys.* B 65, 115 (1997)).

Recently, a theory of chirped mirrors was developed which explains the oscillations as caused by an impedance mismatch in the front part of the mirror (F. X. Kärtner, N. Matuschek, T. Schibli, U. Keller, H. Haus, C. Heine, R. Morf, V. Scheuer, M. Tilsch and T. Tschudi, *Opt. Lett.* 22, 831 (1997); N. Matuschek, F. X. Kärtner, and U. Keller, *Conference on Laser and Electrooptics* (CLEO '98), San Francisco, Calif., May 3–8, paper CThC6 (1998); N. Matuschek, F. X. Kärtner, and U. Keller, *IEEE J. Sel. Topics Quantum Electron,* 4, 197 (1998); N. Matuschek, F. X. Kärtner, and U. Keller, *IEEE J. Quantum Electron.* 35, 129 (1999)). This mismatch of the characteristic impedance is responsible for the formation of an effective Gires-Tournois-interferometer (GTI), i.e., slight reflections in the front section interfere with strong reflections from the back, leading to oscillations well known for a GTI. In principle, for the design of a chirped mirror, the mismatch problem can be decomposed into two different matching problems effectively giving rise to two separate GTIs:

a) A GTI is formed due to an impedance mismatch of the designed stricture to the theoretically assumed refractive index of the ambient medium. For the generation of an initial design, it might be advantageous, to assume an ambient medium that is different from the actual ambient medium, which is typically air.

b) An additional GTI-like effect occurs due to the impedance mismatch between the theoretically assumed refractive index and the actual refractive index of the ambient medium.

We note that two special cases are included in both matching problems. If an initial design is obtained under the assumption that the ambient medium is air, the matching problem b) does not exist. In the same way, for an initial design that is obtained for an arbitrary refractive index, the matching problem b) also does not exist, if the refractive index of the ambient medium is identical to the theoretically assumed index for the ambient medium. In principle, the assumed refractive index can have any value that is appropriate for the generation of the theoretical design. From the theoretical point of view, for the case of a binary multilayer system, promising candidates are the refractive index of the low- or high-index layer, the arithmetic or geometric average refractive index, or the effective refractive index. However, the choice is not limited to these indices. A typical solution for problem b) is a multilayer subsection, which acts as an antireflection (AR) coating, that matches the theoretically assumed refractive index to the index of the ambient medium. We point out that for practical designs no absolutely perfect solution for either of the matching problems exists.

As mentioned above, in a standard chirped mirror one tries to solve both matching problems simply by using special optimization algorithms for the reduction of unwanted oscillations. It is obvious that this uncontrolled method of solving the involved matching problems does not lead to mirror structures with an optimum design performance. The theory derived in previous publications (F. X. Kärtner, N. Matuschek, T. Schibli, U. Keller, H. Haus, C. Heine, R. Morf, V. Scheuer, M. Tilsch and T. Tschudi, *Opt. Lett.* 22, 831 (1997); N. Matuschek, F. X. Kärtner, and U. Keller, *Conference on Laser and Electrooptics* (CLEO '98), San Francisco, Calif., May 3–8, paper CThC6 (1998); N. Matuschek, F. X. Kärtner, and U. Keller, *IEEE J. Sel. Topics Quantum Electron.* 4, 197 (1998); N. Matuschek, F. X. Kärtner, and U. Keller, *IEEE J. Quantum Electron.* 35, 129 (1999)) offers an analytical way for solving the matching problem a). One possibility to avoid GTI-like oscillations caused by problem a) is to use the double-chirped mirror (DCM) design technique.

A double-chirped mirror (DCM) is a multilayer interference coating that can be considered as a composition of four sections. FIG. 1 is a schematic drawing of a standard DCM 101 according to the prior art, composed of four multilayer sections 104, 131–133 deposited on a substrate 102. Each of the sections 104, 131–133 serves a different task (see, e.g., N. Matuschek, F. X. Kärtner, and U. Keller, *IEEE J. Quantum Electron.* 35, 129 (1999)). The first section 104 is a broadband AR coating, typically consisting of 10–14 layers (not shown separately). This AR coating 104 solves the matching problem b), as mentioned above. In the specific case discussed here, it matches the refractive index of a low-index material 103.1 to the refractive index of an ambient medium 105, e.g., air. The other sections 131–133 represent the actual DCM structure 103, as derived from theory. Typically, the mirror structure 103 consists of a plurality of alternately low-index layers 103.11, 103.12, . . . and high-index layers 103.21, 103.22, . . . made of dielectric and/or semiconductor materials. The double-chirp section 131 is responsible for the elimination of the oscillations in the GDD caused by problem a). Double-chirping means that, in addition to the local Bragg wavelength, the local coupling of an incident electromagnetic wave to a reflected electromagnetic wave is independently chirped. This corresponds to an adiabatic matching of the impedance. In terms of optical thicknesses, this means that for a fixed Bragg wavelength, the coupling strength is independently increased by increasing the duty cycle of the high-index layer from layer pair to layer pair from zero to 0.5. Here, duty cycle denotes the ratio of the optical thickness of the low-index layer 103.11 or high-index layer 103.21 to the optical thickness of the whole layer pair 103.11, 103.21. We mention that the same impedance matching is achieved by inverse double-chirping, i.e., the duty cycle of the low-index layer is increased for a fixed Bragg wavelength. In this case, the AR-coating section 104 has to match from air 105 to the index of the high-index layer. In a simple-chirp section 132, only the Bragg wavelength is chirped, whereas in a quarter-wave section 133 the Bragg wavelength is kept constant. This method produces a high reflectance for the long wavelengths (F. X. Kärtner, N. Matuschek, T. Schibli, U. Keller, H. Haus, C. Heine, R. Morf, V. Scheuer, M. Tilsch and T. Tschudi, *Opt. Lett.* 22, 831 (1997); N. Matuschek, F. X. Kärtner, and U. Keller, *Conference on Lasers and Electrooptics* (CLEO '98), San Francisco, Calif., May 3–8, paper CThC6 (1998); N. Matuschek, F. X. Kärtner, and U. Keller, *IEEE J. Sel. Topics Quantum Electron.* 4, 197 (1998); N. Matuschek, F. X. Kärtner, and U. Keller, *IEEE J. Quantum Electron.* 35, 129 (1999)). Additionally, the proper choice of the chirp function (chirp law) used for the chirp of the Bragg wavelength in the simple-chirp section 132 and double-chirp section 131 allows for an analytical custom-tailoring of the GDD (including higher-order dispersion) (N. Matuschek, F. X. Kärtner, and U. Keller, *IEEE J. Quantum Electron.* 35, 129 (1999)).

Incident light 161 travels through the antireflection (AR) coating 104, is reflected somewhere inside the theoretical DCM structure 103, depending on the light wavelength, and leaves the device 101 as reflected light 162. The layer materials considered here are dielectrics such as $SiO_2$ and $TiO_2$. However, the design principles covered by this patent are generally valid and are not restricted to binary multilayer coatings composed of these materials. For example, each section could be composed of different materials, which might also be semiconductor materials (see, e.g., R. Paschotta, G. J. Spühler, D. H. Sutter, N. Matuschek, U. Keller, M. Moser, R. Hövel, V. Scheuer, G. Angelow, and T. Tschudi, submitted to *Appl. Phys. Lett.*, (1999); G. J. Spühler, R. Paschotta, D. H. Sutter, N. Matuschek, U. Keller, M. Moser, R. Hövel, V. Scheuer, G. Angelow, and T. Tschudi, *Conference on Lasers and Electrooptics* (CLEO '99), Baltimore, Md., May 23–28, paper CTuR5 (1998)).

Based on the DCM approach and using simple numerical refinement techniques, essential improvements in the mirror design have been achieved. In combination with a high-precision state-of-art ion-beam sputtering fabrication process (V. Scheuer, M. Tilsch, T. Tschudi, *SPIE Conf. Proc.* 2253, 445 (1994)) and an active layer control during growth (M. Tilsch, V. Scheuer, T. Tschudi, *SPIE Conf Proc.* 2253, 414 (1994)), this results in chirped mirror structures with superior performance compared to standard chirped mirror designs. For example, with our DCMs we generated the shortest pulses ever obtained directly from a laser oscillator (see, e.g., I. D. Jung, F. X. Kärtner, N. Matuschek, D. H. Sutter, F. Morier-Genoud, G. Zhang, U. Keller, V. Scheuer, M. Tilsch, and T. Tschudi, *Opt. Lett.* 22, 1009 (1997); U. Morgner, F. X. Kärtner, S. H. Cho, A. Haus, J. G. Fujimoto, E. P. Ippen, V. Scheuer, G. Angelow, and T. Tschudi, *Opt. Left.* 24, 411 (1999); D. H. Sutter, G. Steinmeyer, L. Gallmann, N. Matuschek, F. Morier-Genoud, U. Keller, V. Scheuer, G. Angelow, and T. Tschudi, *Opt. Lett.* 24, 631 (1999)). Another example is the broadband tunability of ultrashort laser pulses without changing the cavity mirrors (D. H. Sutter, I. D. Jung, N. Matuschek, F. Morier-Genoud, F. X. Kärtner, and U. Keller, *Conference on Lasers and Electrooptics* (CLEO '98), San Francisco, Calif., May 3–8, paper CThC5 (1998)).

Although a DCM contains two sections (double-chirp section and AR coating), which separately solve the problem of the impedance mismatch caused by problems a) and b), respectively, one still observes remaining oscillations in the GDD. The reason is that the matching sections cannot provide a perfect matching. We have shown for a DCM that remaining oscillations in the GDD arc essentially due to imperfections of the AR-coating section (N. Matuschek, F. X. Kärtner, and U. Keller, *Conference on Lasers and Electrooptics* (CLEO '98), San Francisco, Calif., May 3–8, paper CThC6 (1998); N. Matuschek, F. X. Kärtner, and U. Keller, *IEEE J. Sel. Topics Quantum Electron.* 4, 197 (1998)). Or, the other way around, without the refractive index jump from the theoretically assumed refractive index to the actual index of the ambient medium (problem b)), the oscillations can be reduced to a negligibly small value. This means that the double-chirp section leads to an almost perfect solution for problem a). Also including this refractive-index jump, one finds that the oscillations in the GDD are only suppressed to a certain level, if the residual reflectance of the AR coating is lower than about $10^{-4}$ (N. Matuschek, F. X. Kärtner, and U. Keller, *IEEE J Sel. Topics Quantum Electron.* 4, 197 (1998)). For the DCM considered here, the bandwidth, over which such low reflectances can be achieved, is limited to about 240 nm (680–920 nm) (see FIG. 6(*a*) dashed line, and N. Matuschek, F. X. Kärtner, and U. Keller, *IEEE J Sel. Topics Quantum Electron.* 4, 197 (1998)). This bandwidth gives a good estimate for the bandwidth of a DCM with relatively small oscillations in the GDD.

SUMMARY OF THE INVENTION

The invention discloses a way for almost completely avoiding oscillations in the GDD. According to the invention, the layers are coated on the back side of a substrate with a refractive index equal or close to the theoretically assumed refractive index of the ambient medium. In the case of a DCM, the refractive index of the substrate should be close to the index of the low-index layer (or high-index layer if the structure is inversely double-chirped). An almost perfect impedance matching of the double-chirp section and the substrate can be achieved if the low-index layer consists of sputtered $SiO_2$ and the substrate is made of fused silica. In the following, we call chirped mirror structures, which are coated on the back side of the substrate, back-side coated chirped mirrors (BASIC chirped mirrors). In the special case of a DCM coating on the back side, we speak about a BASIC DCM.

For BASIC chirped mirrors, no additional AR coating would be required in order to eliminate oscillations. However, such a coating is required on the front side of the substrate in order to avoid additional losses, i.e., to increase the net reflectance of the mirror. The main advantage of the BASIC chirped mirror principle is that there is no requirement on the quality of the AR coating with respect to GDD oscillations. Thus, a residual reflectance of the AR coating can be allowed up to a level that is tolerable for additional losses. It follows that the bandwidth can be extended in comparison to the bandwidth of the AR-coating section in a standard DCM. In particular, the AR coating on the front side of the substrate can be considered as an independent coating, which can be independently designed and optimized. This means that the substrate is treated as a non-interfering thick layer. The condition of a non-interfering substrate layer is fulfilled if the substrate is sufficiently thick, i.e., much thicker than the spatial extension of the light pulse. Additionally, the front side must not be parallel to the back side of the substrate. This can be accomplished either by wedging of the substrate or by choosing different centers of curvature for both sides.

It is important to note that a light pulse reflected by a BASIC chirped mirror has to pass the AR coating (if there is one coated on the front side) and the substrate, is reflected by the chirped mirror structure, and passes the substrate and AR coating once again. Thus, the total GDD of a BASIC chirped mirror (including an AR coating) for one bounce is given by the GDD upon reflection of the theoretical DCM structure and two times the GDD upon transmission of the AR coating and the substrate. Here, we recall that the thicker the substrate the more positive GDD is added to the negative GDD of the theoretical DCM structure because of the positive material dispersion. On the other hand, if the substrate is too thin the stability of the coating is reduced and the surface might become distorted.

In summary, the basic idea of the invention is the use of a back-side coating to provide impedance matching and thus to suppress GD and GDD oscillations of a chirped mirror structure. By a chirped mirror, any mirror structure that provides a controlled dispersion characteristic is meant. In a generalized sense, back-side coating on a substrate means any realization of a chirped mirror structure, where the incident light travels through a non-interfering thick layer (bulk material). Here, we call this thick layer the "substrate". An example for another realization is that the chirped mirror structure is surrounded on both ends by a thick layer, from which one can be called substrate. The idea of using substrate materials for achieving impedance matching covers any realization in which a chirped mirror structure is designed assuming a refractive index for the ambient medium which is different from the index of the actual ambient medium. This covers also the case if the actual ambient medium is not air but any other material. An important extension of the functionality of the BASIC chirped mirror is an AR coating on the opposite side of the substrate. However, it is important that the reflection of this coating does not interfere with the reflection of the back-side coating. For the invention, the AR coating is not necessarily required. Computer optimization or complete generation of the coating design significantly enhances the performance.

BRIEF DESCRIPTION OF THE DRAWINGS

FIG. 2a is a schematic drawing of a first embodiment of a backside coated chirped mirror (BASIC chirped mirror) according to the invention, namely a BASIC single-chirped mirror (SCM).

FIG. 2b is a schematic drawing of a second embodiment of a backside coated chirped mirror (BASIC chirped mirror) according to the invention, namely a BASIC double-chirped mirror (DCM).

FIG. 5a shows the reflectance calculated for two BASIC SCM structures according to the invention.

FIG. 5b shows the GD calculated for two BASIC SCM structures according to the invention.

In FIGS. 7b and 7c, the dashed line represents the desired target GD and GDD, respectively.

FIG. 8a shows the calculated differences between the designed and desired GD.

FIG. 8b shows the calculated differences between the designed and desired GDD. The solid lines show results for the BASIC-DCM according to the invention, and the dashed lines for a standard DCM according to the state of the art.

FIG. 9a shows the measured GDD; the the dotted line represents the desired GDD of a theoretical DCM structure (without substrate and AR coating) coated on the back side of a substrate. The dash-dotted and dashed lines show the desired GDD upon transmission of the substrate and the AR coating is added to the dotted curve, for two different substrate thicknesses.

FIG. 9b shows the difference between the measured and desired target GDD; the result of a typical GDD measurement for a BASIC-DCM according to the invention (solid line) is compared with the result for an ultra broadband standard DCM according to the state of the art (dashed line). upon transmission of the substrate and the AR coating is added to the dotted curve, for two different substrate thicknesses. In (b), the result of a typical GDD measurement for a BASIC-DCM according to the invention (solid line) is compared with the result for an ultrabroadband standard DCM according to the state of the art (dashed line).

DETAILED DESCRIPTION OF THE PREFERRED EMBODIMENTS

Figure 1:
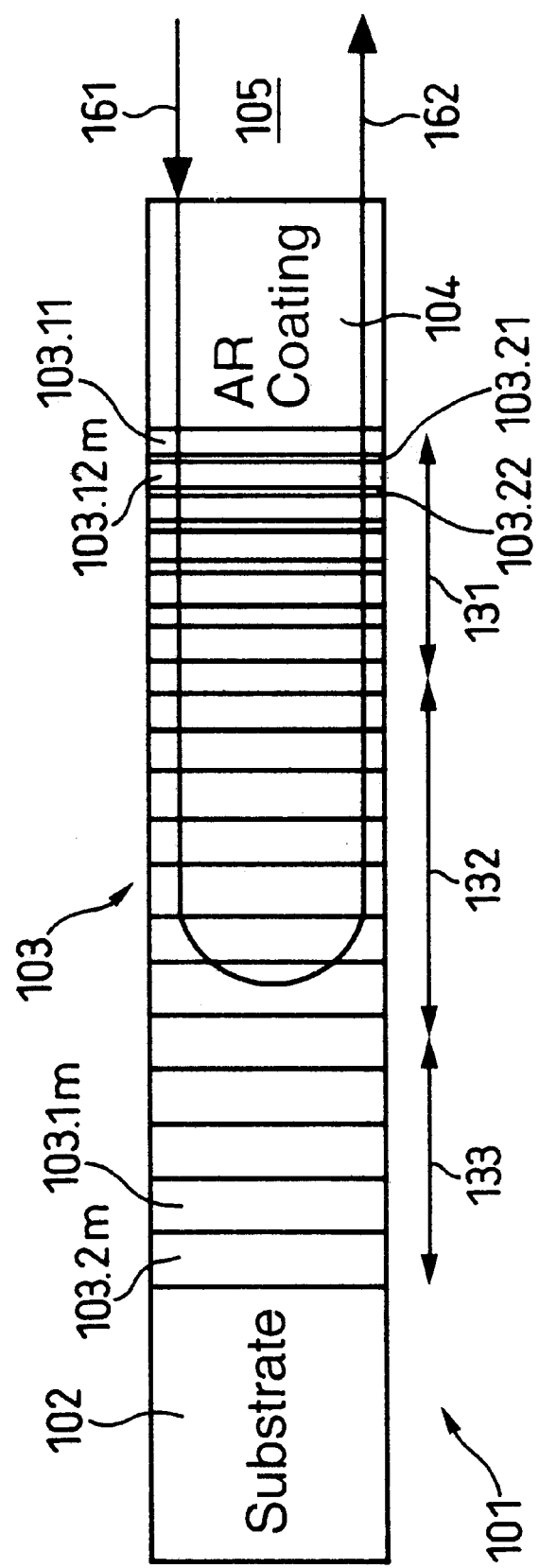
FIG. 1 is a schematic drawing of a standard double-chirped mirror (DCM) according to the prior art.

FIGS. 2a and 2b are schematic drawings of two embodiments of back-side coated chirped mirrors 1 (BASIC chirped mirrors) according to the invention. A chirped-mirror structure 3 is coated on a back side 22 of a dielectric and/or semiconductor substrate 2. The mirror structure 3 of FIG. 2a is a BASIC simple-chirped mirror (SCM), whereas the mirror structure 3 of FIG. 2b is a BASIC double-chirped mirror (DCM). The chirped-mirror structure 3 preferably comprises a stack of alternately high-index layers 3.2l, ..., 3.2m and low-index layers 3.1l, ..., 3.1m made of dielectric and/or semiconductor materials. The low-index layers 3.1l, ..., 3.1m may consist, e.g., of $SiO_2$, and the high-index layers 2.1l, ..., 3.2m of $TiO_2$. There are typically $2m \approx 50$–60 layers in one chirped-mirror structure 3. The substrate 2 may consist of a standard optical substrate material such as fused silica or BK7 glass. If the chirped-mirror structure 3 is a DCM (FIG. 2b), the refractive index of the substrate 2 is chosen to be close to the refractive index of the low-index layers 3.1l, 3.1m; in the case of an inversely double-chirped-mirror structure 3, the refractive index of the substrate 2 is chosen to be close to the refractive index of the high-index layers 2.1l, ..., 3.2m. The refractive index of sputtered SiO, ($n_{SiO_2} \approx 1.49$ @800 nm) is close to the refractive index of standard substrate materials (fused silica $n_{FS} \approx 1.45$, BK7 $n_{BK7} \approx 1.51$ @800 nm). Thus, if the chirped mirror structure 3 is designed assuming the ambient medium 5 to be $SiO_2$, the input impedance of the double-chirp section is almost perfectly matched to the impedance of the substrate material 2.

The BASIC chirped mirrors 3 of FIGS. 2a and 2b include an optional AR-coating section 4 on a front side 21 of the substrate 2. AR coatings are well known in the art; they typically include a stack of alternately low-index and high-index dielectric and/or semiconductor quarter-wave layers (not shown in detail) Such as $SiO_2$ and $TiO_2$ layers, respectively. Incident light 61 travels through both the AR coating 4 and the substrate 2 and is then reflected somewhere inside the chirped mirror structure 3. For BASIC chirped mirrors 3, no additional AR coating 4 would be required in order to eliminate oscillations. However, such a coating is required on the front side 21 of the substrate 2 in order to avoid additional losses, i.e., to increase the net reflectance of the device.

The substrate 2 is supposed to be a non-interfering layer. The condition of a non-interfering substrate layer 2 is fulfilled if the substrate 2 is sufficiently thick, i.e., much thicker than the spatial extension of the light pulse. Another condition for non-interference is that the front side 21 must not be parallel to the back side 22 of the substrate 2. This can be accomplished either by wedging of the substrate 2 (cf. FIG. 10) or by choosing different centers of curvature for both surfaces 21, 22 (cf. FIG. 11).

In the following, we discuss various realizations of BASIC chirped mirrors. First, we consider a BASIC DCM with a substrate index equal to the refractive index of the low-index layer (cf. FIG. 2b). Secondly, we consider a similar BASIC DCM with a substrate index equal to the refractive index of the high-index layer and an inverse DCM structure. Then we show that the principle can be applied not only to DCM structures but also to any chirped mirror structure. As an example, we design a BASIC simple-chirped mirror (SCM, cf. FIG. 2a) with a substrate index equal to the geometric average of the indices of the high- and low-index layer, respectively. Finally, we show results for actually manufactured BASIC DCMs and compare these results with results obtained for a standard DCM.

Figure 3A:
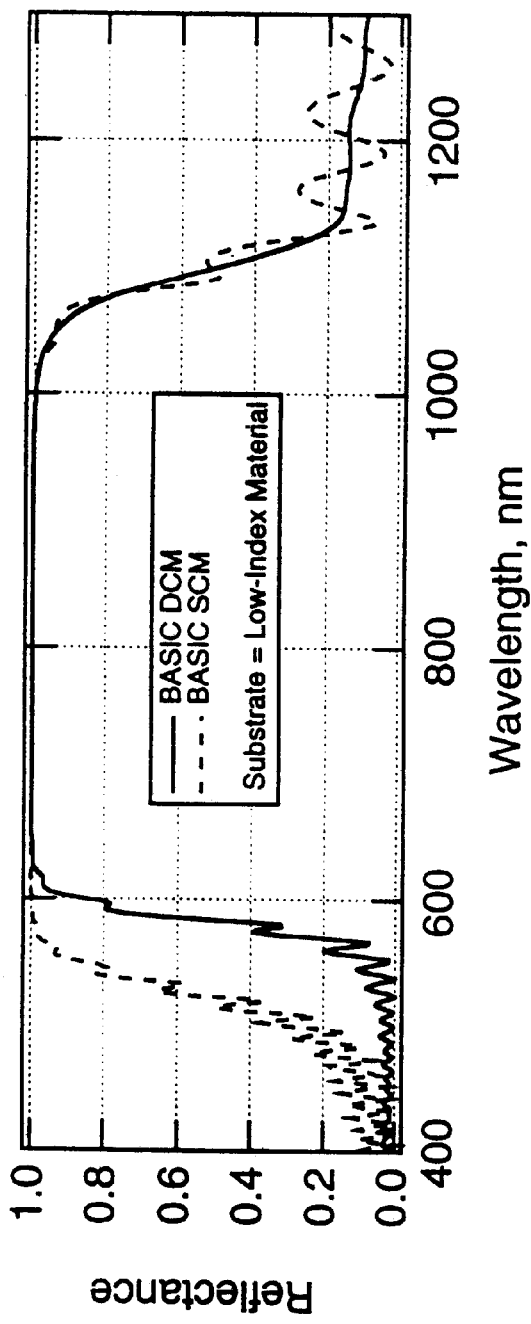
FIG. 3a shows the reflectance calculated for two BASIC chirped mirror structures according to the invention.
Figure 3B:
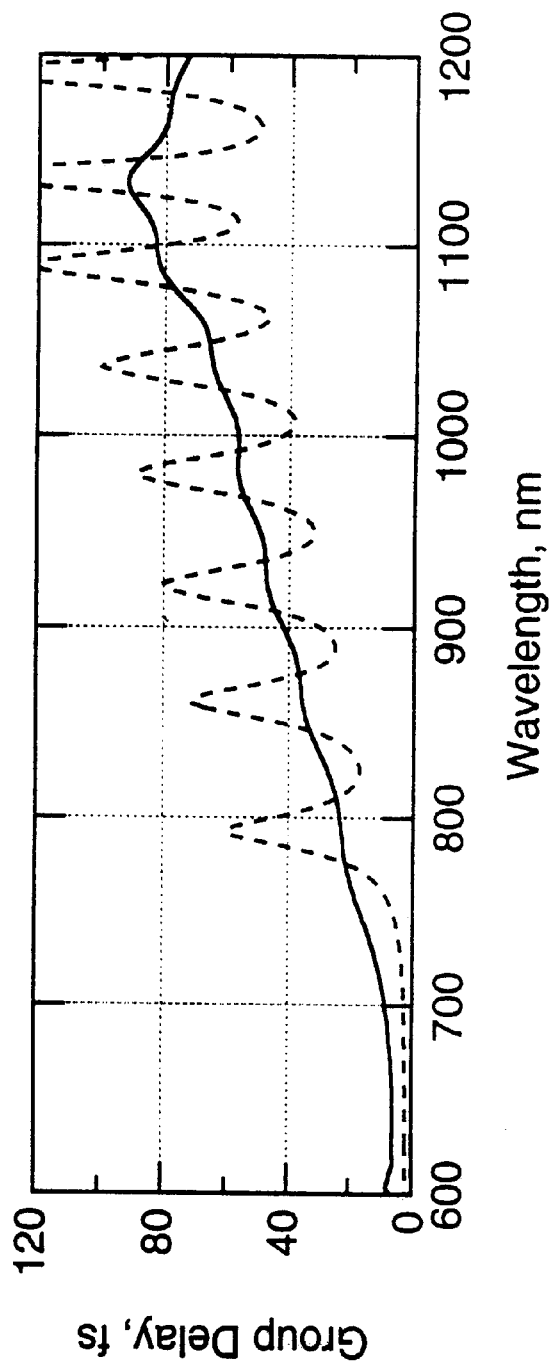
FIG. 3b shows the group delay (GD) calculated for two BASIC chirped mirror structures according to the invention. two BASIC chirped mirror structures according to the invention. It is assumed that the refractive index of the substrate is equal to the refractive index of the low-index material.

FIGS. 3a and 3b show results for two special realizations of a BASIC chirped mirror. The solid lines correspond to a BASIC chirped mirror, where the back-side coating 3 is a DCM structure in which double-chirping is achieved by increasing the duty cycle of the high-index layer from zero to 0.5. The dashed lines correspond to a BASIC SCM structure, i.e., the duty cycle is kept constant on the value 0.5 for all layer pairs. The refractive index of the substrate material 2 is assumed to be equal to the index of the low-index material 3.1l, ..., 3.1m. For the FIGS. 3a, 3b, 4a, 4b, 5a, and 5b, we chose the constant refractive indices $n_l=1.5$ for the low-index material 3.1l, ..., 3.1m and $n_h=2.5$ for the high-index material 2.1l, ..., 3.2m. As can be seen, no impedance matching is achieved with the SCM structure on the back side 22 of the substrate 2, resulting in a broad bandwidth but large oscillations in the GD. For the BASIC DCM a very good impedance matching is achieved with the theoretical DCM design. The oscillations are strongly reduced at the expense of some of the high-reflectance bandwidth for the short wavelengths, as it is explained in N. Matuschek, F. X. Kärtner, and U. Keller, *IEEE J. Sel. Topics*

Quantum Electron. 4, 197 (1998). Small residual oscillations are due to a slight imperfection of the double-chirp section. To achieve impedance matching, the coupling strength was approximately linearly chirped, while we have shown that a quadratic increase of the coupling strength leads to an almost perfect impedance matching (see N. Matuschek, F. X. Kärtner, and U. Keller, *IEEE J. Sel. Topics Quantum Electron.* 4, 197 (1998)). It is important to note that using simple local optimization techniques the oscillations can be reduced to a negligible small value (compare with FIGS. 7a, 7b, 7c, 8a, and 8b).

Figure 4A:
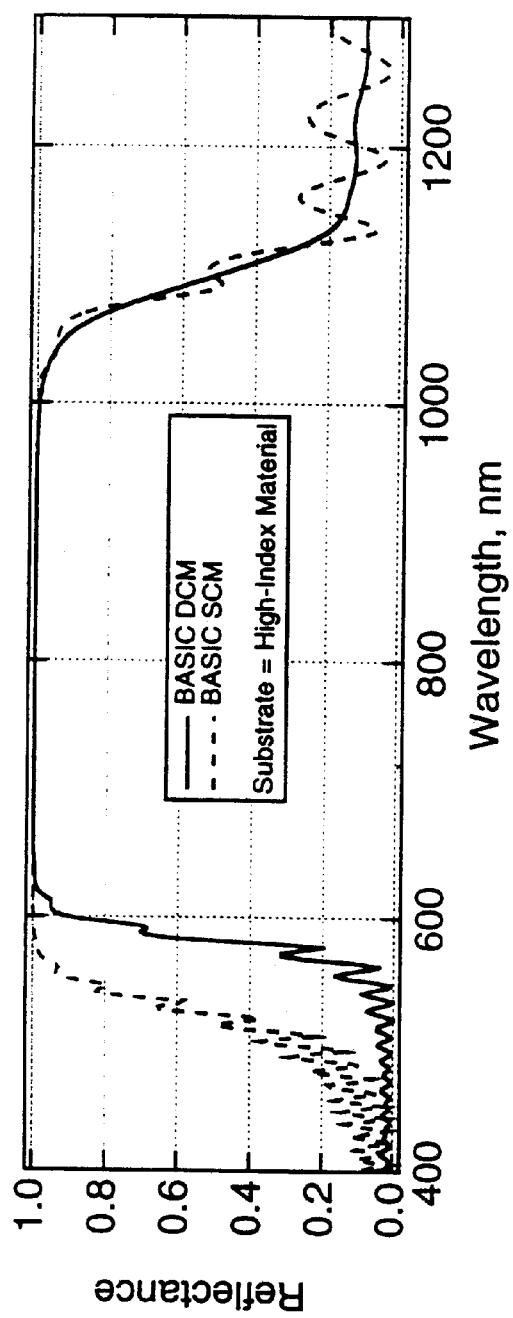
FIG. 4a shows the reflectance calculated for two BASIC chirped mirror structures according to the invention.
Figure 4B:
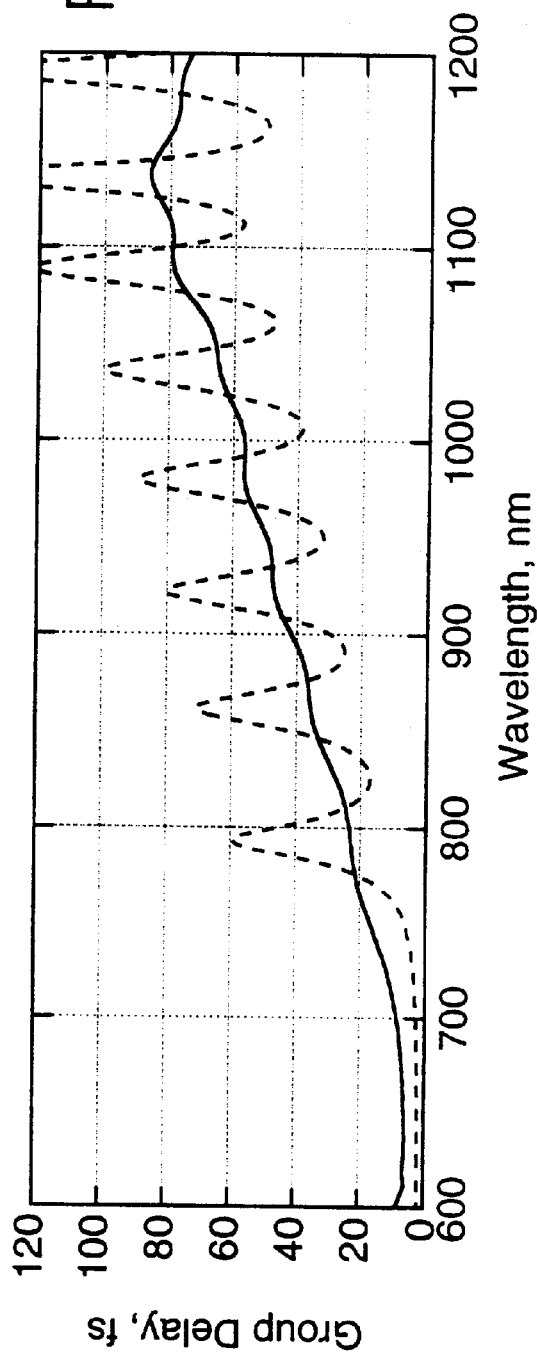
FIG. 4b shows the GD calculated for two BASIC chirped mirror structures according to the invention. In contrast to FIGS. 3a and 3b, it is assumed that the refractive index of the substrate is equal to the refractive index of the high-index material.

FIGS. 4a and 4b show results for two other realizations of a BASIC chirped mirror 1 similar to the mirror structures used for FIGS. 3a and 3b. However, now the refractive index of the substrate 2 is assumed to be equal to the refractive index of the high-index layers 2.1l, . . . , 3.2m. Again, the solid lines show results for a DCM structure where double-chirping is achieved by increasing the duty cycle of the low-index layer form zero to 0.5, and the dashed lines correspond to a BASIC SCM with a duty cycle kept constant on the value 0.5. The refractive index of the substrate 2 leads to a very good impedance matching for an inverse DCM, i.e., the duty cycle of the low-index layers 3.1l, . . . , 3.1m is monotonically increased from zero to 0.5. The results for reflectance and GD are almost exactly the same as in FIGS. 3a and 3b.

In FIGS. 5a and 5b, we demonstrate one realization for a chirped mirror device 1 for which a substrate index can be found that yields impedance matching (at least partially), although the back-side coating 3 is not a DCM. More precisely, we use an SCM structure, i.e., the duty cycle is kept constant on the value 0.5 for all pairs, and the refractive index of the substrate 2 is chosen to be the geometric average of the refractive indices $n_h$ of the high-index layers 2.1l, . . . , 3.2m and the refractive indices of the low-index layers 3.1l, . . . , 3.1m:

$$n_{av} = \sqrt{n_h \cdot n_l} \approx 1.94.$$

The solid lines show FIG. 5a the reflectance and FIG. 5b GD, respectively, for this device. As can be seen, the oscillations are better suppressed for the longer wavelengths than for the shorter wavelengths. In agreement with the observed result, a theoretical analysis shows that, indeed, a better impedance matching is achieved for the longer wavelengths. Thus, one has to start chirping the Bragg wavelength of the device 1 with shorter wavelengths compared to FIGS. 3a, 3b, 4a, and 4b. The dashed lines show results if, e.g., the substrate index is chosen to be equal to the index $n_1$ of the low-index layers 3.1l, . . . , 3.1m. Obviously, the same large oscillations as shown in FIGS. 3a, 3b, 4a, and 4b can be observed. The figure clearly shows that (partial) impedance matching can be achieved even for SCM structures if the refractive index of the substrate material 2 is properly chosen.

In the following FIGS. 6a, 6b, 6c, 6d, 7a, 7b, 7c, 8a, 8b, 9a and 9b we show the results for an example of a designed and fabricated BASIC DCM design. The theoretically obtained DCM structure has been numerically refined with a local gradient algorithm, as mentioned above. The AR coating on the front side has been independently designed and optimized with a commercial software.

Figure 6C:
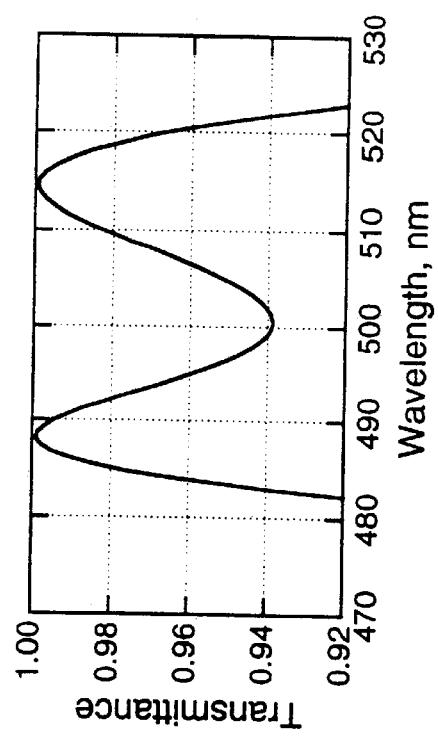
FIG. 6c shows a local transmittance around $\lambda=500$ nm calculated for an 18-layer AR coating on the front side of a fused silica substrate.
Figure 6D:
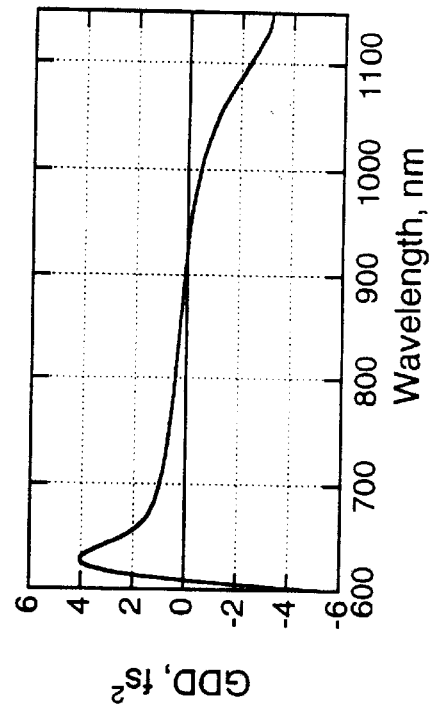
FIG. 6d shows a GDD upon transmission calculated for an 18-layer AR coating on the front side of a fused silica substrate.
Figure 6A:
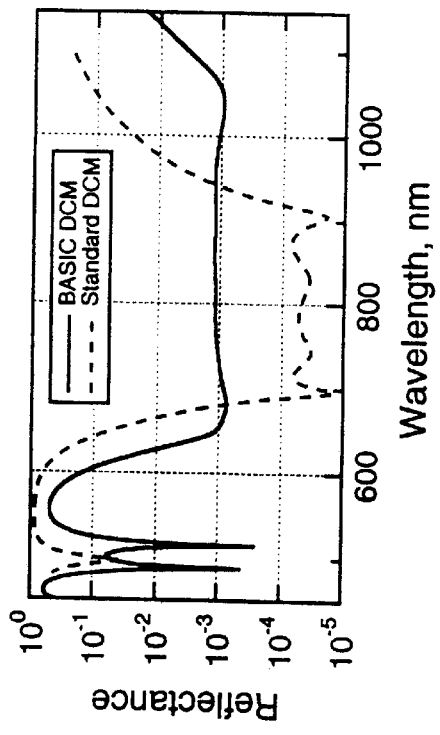
FIG. 6a shows a reflectance calculated for an 18-layer AR coating on the front side of a fused silica substrate, and, with a dashed line, the reflectance of an AR coating of a standard DCM according to the state of the art is shown.
Figure 6B:
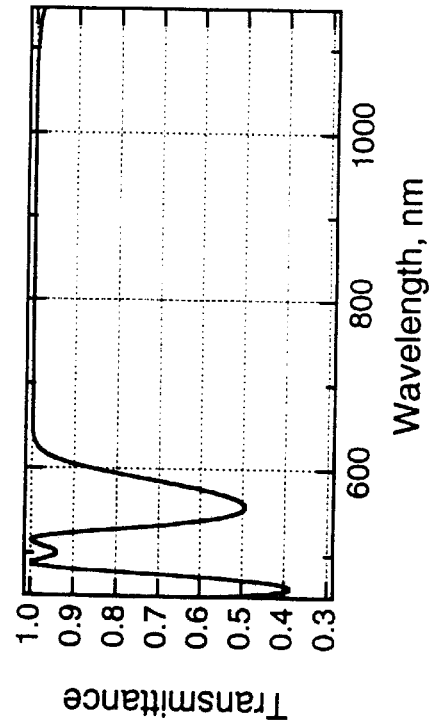
FIG. 6b shows a global transmittance calculated for an 18-layer AR coating on the front side of a fused silica substrate.

FIGS. 6a, 6b, 6c, and 6d shows the spectral response characteristic of an 18 layer AR coating 4 on the front side 21 of a fused silica substrate 2. The angle of incidence is 5°, and the incident light 61 is p-polarized. The figures show FIG. 6a the reflectance, FIG. 6b the global transmittance, FIG. 6c the local transmittance around the wavelength $\lambda=500$ nm for an argon-ion pump laser, and FIG. 6d the GDD upon transmission. In FIG. 6a, additionally the reflectance of the AR coating 104 of a standard DCM 101 is shown (dashed line). Obviously, the broader bandwidth of the AR coating 4 of the BASIC DCM 1 is at the expense of a higher residual reflectance. The AR coating 4 analyzed in FIG. 6a (solid line) has a residual reflectance of about 1%. We decided that such a loss level is acceptable for the use of these devices 1 in our laser. This reflectance has to be compared with the reflectance of an AR coating 104 of a standard DCM 101. The dashed line shows the reflectance of such an AR coating 104 consisting of 14 layers (N. Matuschek, F. X. Kärtner, and U. Keller, *IEEE J. Sel. Topics Quantum Electron.* 4, 197 (1998)). As can be seen, by allowing the reflectance to be more than one order of magnitude larger, the bandwidth can be extended to about 450 nm (640–1090 nm). In this example, additionally a transmission window for the argon-ion pump laser was required. This constraint prevents the design of an even better AR coating. FIGS. 6b and 6c show the corresponding transmittance of the AR coating 4. In FIG. 6d, the GDD upon transmission is depicted. Obviously, the GDD is smooth and almost vanishing over the operating wavelength range of the AR coating 4.

Figure 7A:
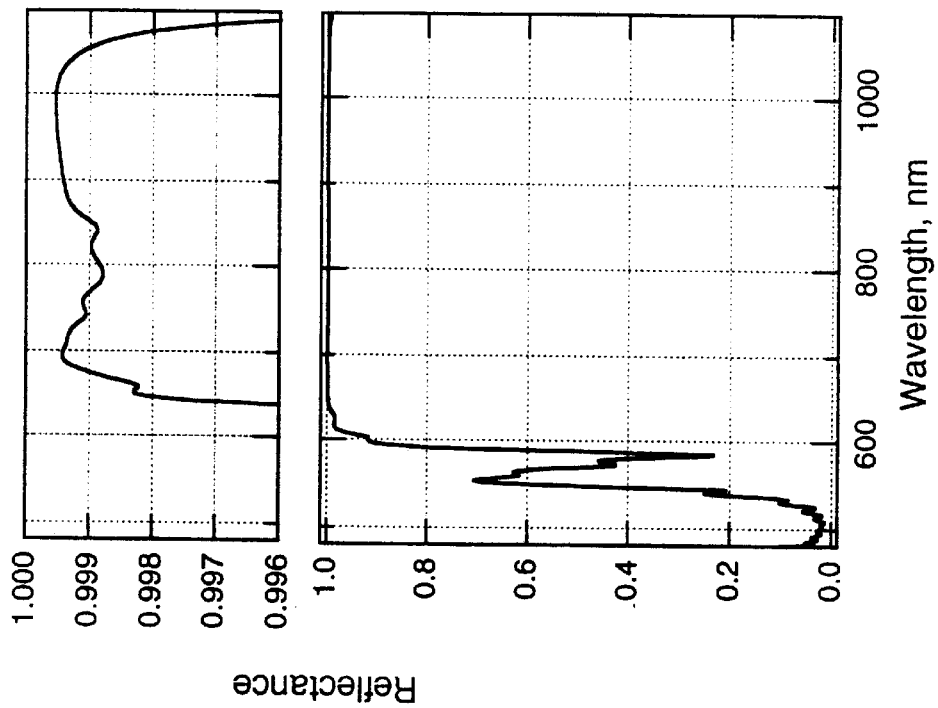
FIG. 7a shows the reflectance calculated for a 60-layer DCM structure on the back side of the fused silica substrate according to the invention.
Figure 7B:
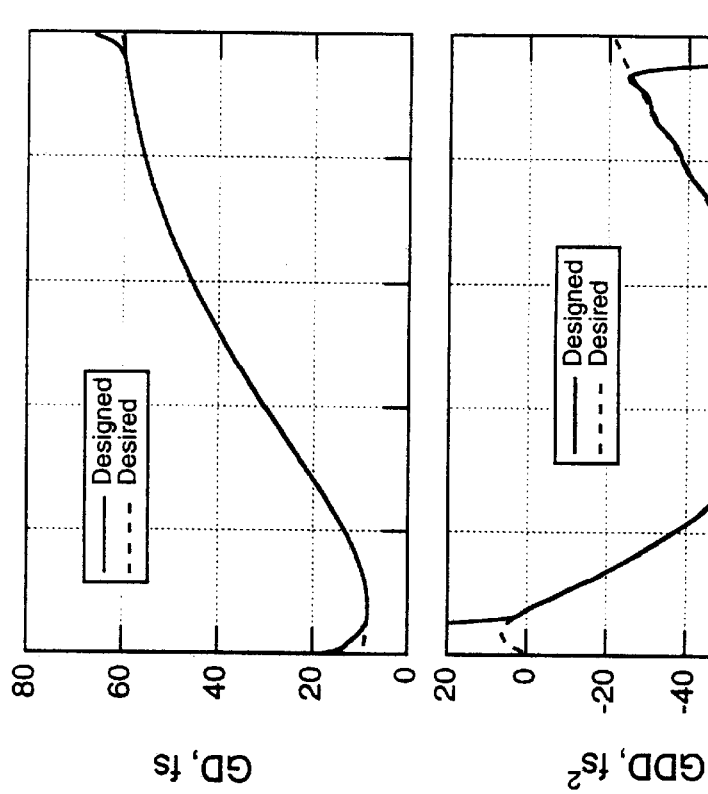
FIG. 7b shows the GD upon reflection calculated for a 60-layer DCM structure on the back side of the fused silica substrate according to the invention.
Figure 7C:
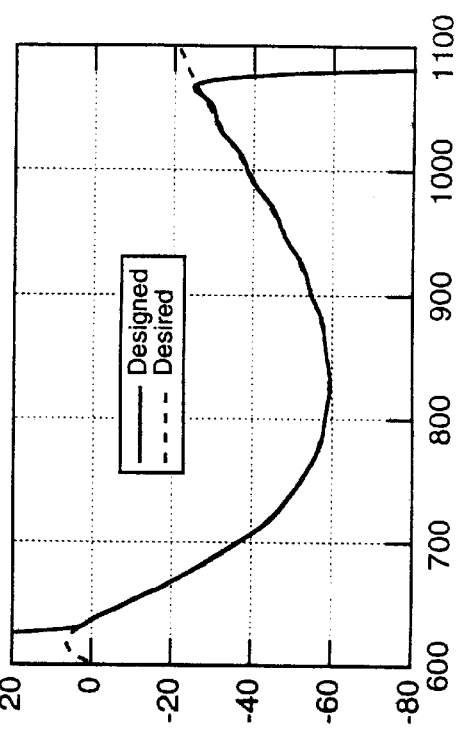
FIG. 7c shows the GDD upon reflection calculated for a 60-layer DCM structure on the back side of the fused silica substrate according to the invention. The dispersion of the coating only has been shown; the dispersion of the substrate has not been added.

FIGS. 7a, 7b, and 7c shows the spectral response characteristic of the back-side coating 3 of the BASIC DCM 1 after computer refinement of the theoretically derived starting design. The substrate 2 is made of fused silica. The figures show FIG. 7a the reflectance, FIG. 7b the GD upon reflection, and (c) the GDD upon reflection of the 60 layer design. In FIGS. 7b and 7c, the dashed line represents the desired target GD and GDD, respectively. The quantities are calculated with respect to an incident medium, which is in our case a fused silica substrate 2. The mirror 3 was designed for p-polarized light with an incidence angle of 5° in air. This corresponds to an incidence angle of about 3.44° in the fused silica substrate 2. The design goal was to achieve a high reflectance and a smooth GDD over the wavelength range, for which the AR coating 4 was designed. Additionally, the mirror 3 should be highly transparent around 500 nm for light of an argon-ion pump laser. As can be seen, all requirements are excellently fulfilled. The designed properties agree perfectly with the desired properties over a bandwidth of 440 nm (630 nm–1070 nm). The quality of this design is only obtained because of the almost perfect matching of the substrate refractive index to the index of the low-index material 3.1l, . . . , 3.1m, as has been already mentioned above. The GD and GDD are extremely smooth over an unprecedented bandwidth.

To illustrate this more precisely, we show in FIGS. 8a and 8b the difference between the desired target functions and the designed properties FIG. 8a GD and FIG. 8b GDD. The solid lines show results for a BASIC DCM 1. On this scale, almost no difference to the target functions is visible. It is noteworthy that the oscillations can still be reduced by giving up the transmission window around 500 nm and by allowing the reflectance to degrade to a certain level. For comparative purposes, we have also plotted in dashed lines the differences in the GD and GDD for a typical ultrabroadband standard DCM 101. The GD oscillates with an amplitude of more than 0.5 fs over a bandwidth of "only" about 380 nm. In the same range the GDD oscillates with an amplitude of about 20 $fs^2$–30 $fs^2$. Multiple bounces on a device 101 with such large oscillations set a fundamental limit in the generation of ultrashort laser pulses.

It is well known that phase properties of chirped mirrors are very sensitive on deposition errors (R. Szipöcs, and A.

Kohazi-Kis, *Apl. Phys.* B 65, 115 (1997); N. Matuschek, I. D. Jung, D. H. Sutter, F. X. Kärtner, U. Keller, V. Scheuer, M. Tilsch, and T. Tschudi, *Conference on Ultrafast Optics,* Monterey, Calif., Aug. 4–7, paper TA-5 (1997)). An average error of only a few Å per layer can lead to strong deviations from the designed phase characteristics. Thus, a lower boundary for the oscillations in the GD and GDD of the fabricated mirrors is given by the oscillations in the designed phase properties. The solid line in FIG. 9a shows the measured GDD for a BASIC DCM (without substrate and AR coating) which is coated on the back side of a substrate. The dotted line is the desired target GDD for a BASIC DCM structure (back-side coating without substrate and AR coating), which is the same as shown in FIG. 7c, dashed line. The thickness of the substrate 2 was specified to be 0.5 mm. The total target GDD (including twice the GDD upon transmission of a 0.5 mm thick substrate 2 and twice the GDD upon transmission of the AR coating 4 shown in FIG. 6d) is depicted by the dash-dotted line. Obviously, this curve does not fit with the average of the measured GDD. Assuming that the substrate 2 is 0.8 mm thick, we obtain the dashed line, which is in good agreement with the measured curve. Therefore, we conclude that the substrates 2 are thicker than specified by the manufacturer. This is not surprising because of the difficulties of precisely fabricating such thin substrates 2. In FIG. 9b, the difference of the measured to the desired GDD is compared for a standard DCM 101 (dashed line) and a BASIC DCM 1 (solid line). For the BASIC DCM 1 the oscillation amplitude is small and does not exceed a value of about 20 fs$^2$ over the whole design wavelength range. Note that over a wide range the accuracy of about 5 fs$^2$ in the measurement of the GDD is almost reached. For the standard DCM 101 the GDD oscillations are up to four times larger over a narrower bandwidth than for the BASIC DCM.

The results discussed in FIGS. 6a, 6b, 6c, 6d, 7a, 7b, 7c, 8a, 8b, 9a and 9b are obtained for a first BASIC DCM design. We expect that they can be improved by further improving the control of the layer thicknesses. As our simulations show, with an average accuracy at the order of about 1 Å per layer, the GDD of the fabricated mirrors 3 should almost agree with the designed GDD. Such an accuracy seems to be in reach. A further advantage of the BASIC chirped mirror design technique (including the AR coating 4) in general is that the most sensitive layers are near the substrate 2 on both sides 21, 22. Therefore, these critical layers are deposited at the beginning of the sputtering process. At this early stage of fabrication, the layers are sputtered with a higher accuracy compared to layers which are sputtered later. BASIC DCMs 1 according to the invention can be implemented in a Ti:sapphire laser, making possible new record-breaking ultrashort laser pulses. For this purpose, very thin but still very stable substrates 2 must be fabricated. These substrates 2 should guarantee a distortion free surface.

FIGS. 10–19 show different technical implementations of backside coated mirrors 1 (BASICs) for dispersion compensation.

Figure 10:
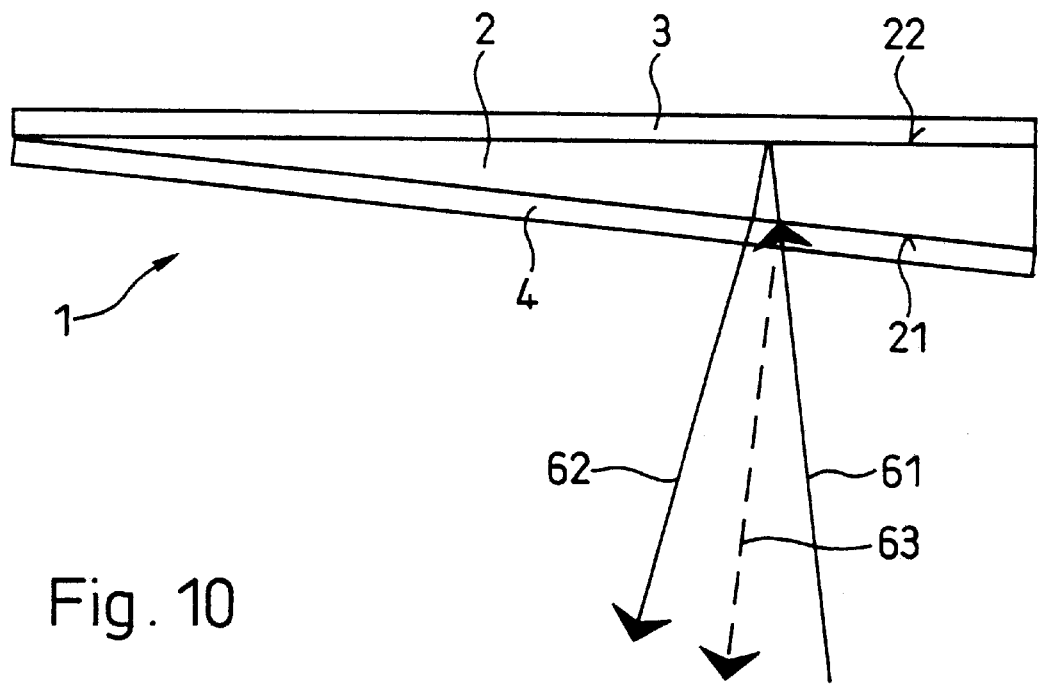
FIG. 10 is a schematic drawing of a BASIC chirped mirror on a wedged substrate.

FIG. 10 shows a simple implementation with the backside coating 3 on one side of a substrate 2. Detrimental reflections 63 from the front surface 21 of the substrate 2 are suppressed by an antireflection coating 4. An additional suppression of interfering front surface reflections can be achieved by wedging the substrate 2 at an angle larger or comparable to the numerical aperture of the input beam 61. In this case, a beam 63 reflected of the front surface 21 is clearly separated from a beam 62 reflected of the back surface 22. It should be pointed out that wedging improves the performance for intracavity applications, but is not absolutely required for most applications.

Figure 11:
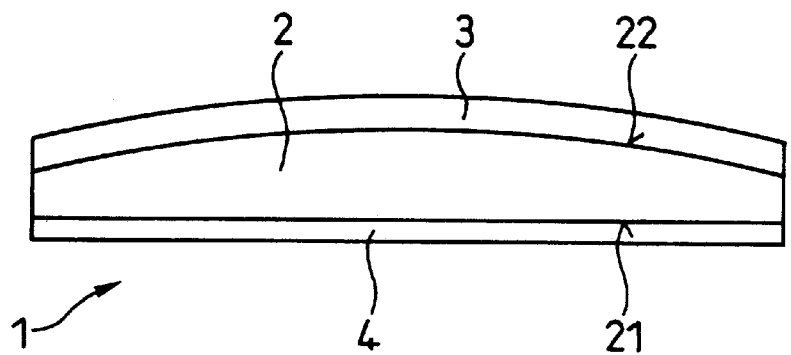
FIG. 11 is a schematic drawing of a BASIC chirped mirror on a thin lens substrate.

FIG. 11 depicts a different implementation on a thin lens substrate 2. Again, an AR-coating 4 is used to reduce reflections of the front surface 21. In this case, a substrate 2 with different radii of curvature of the front surface 21 and the back surface 22 is used to additionally suppress unwanted interference. The plano-convex case shown is a special case that is simplest to fabricate. More generally, plane, convex, or concave surfaces 21, 22 can be used on either side in any combination. To effectively suppress spurious back-reflections it is only required that both surfaces do not share the same center of curvature.

Figure 12:
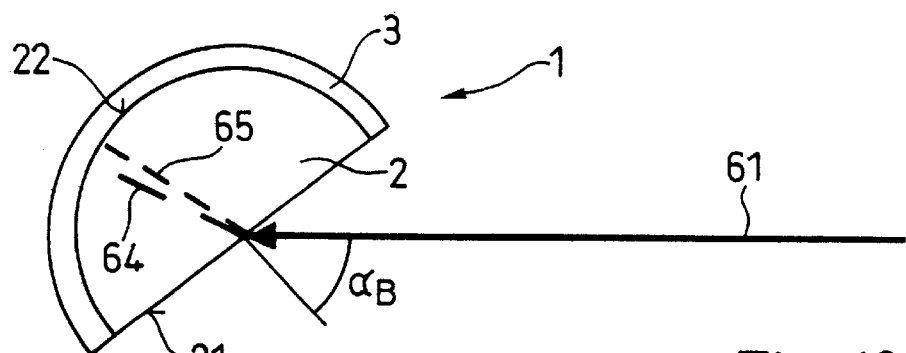
FIG. 12 is a schematic drawing of a BASIC chirped mirror on a semicylindrical or a semispherical substrate.

FIG. 12 shows a way to completely avoid the AR-coating on the front surface 21. In this case a semicylindrical or semispherical substrate 2 is used. The input beam 61 is p-polarized and hits the front surface 21 of the substrate at Brewster's angle $\alpha_B$. This design provides ultrabroadband antireflection for the front surface 21. Additionally, chromatic dispersion can be avoided if the input beam 61 hits the front surface 21 exactly at the center of curvature of the back surface 22 bearing the BASIC coating 3. Although long-wavelength rays 64 follow a different beam path than short wavelength rays 65, the rays all hit the coating 3 at normal incidence and are ideally retroreflected.

Figure 13:
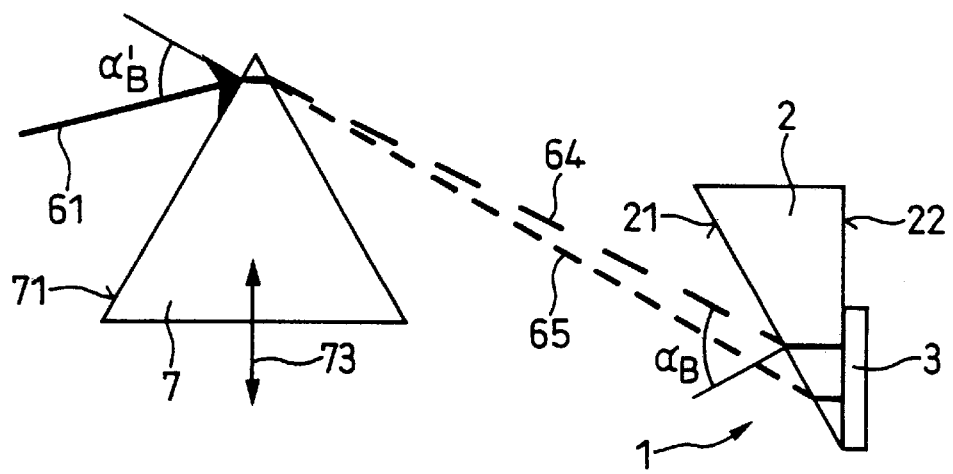
FIG. 13 is a schematic drawing of a modified prism pair, one of the prisms bearing a BASIC chirped mirror.

FIG. 13 illustrates the use of a modified prism pair 7, 2 together with a BASIC coating 3. The p-polarized input beam 61 hits the first surface 71 of the prism 7 at Brewster's angle $\alpha_B'$. The central wavelength ray can be also made to exactly exit at Brewster's angle $\alpha_B'$. The input beam 61 is spread due to the spectral dispersion of the prism 7, as indicated by the long wavelength ray 64 and a short wavelength ray 65. The rays 64, 65 hit the first surface 21 of the second prism 2 close to Brewster's angle $\alpha_B$ to allow for minimum losses. The prism 2 simultaneously serves as a substrate for the BASIC coating 3 on the back surface 22. In a simple version, a half Brewster-prism can be used for the substrate 2. As the beams 64, 65 will not be exactly parallel inside the prism 2 if the same materials for prisms 7 and 2 are used, better parallelism of the beams 64, 65 is achieved if two different materials are used instead. The arrangement of FIG. 13 allows additionally for adjustment of the net dispersion of the set-up by changing the insertion 73 of any of the prisms 7, 2. FIG. 13 has been drawn to illustrate the ideal retro-reflecting case of a prism pair 7, 2 as it is conventionally used for dispersion compensation. More generally, the principle of BASIC coatings 3 can also be applied for deviations from the ideal retro-reflecting geometry.

Figure 14:
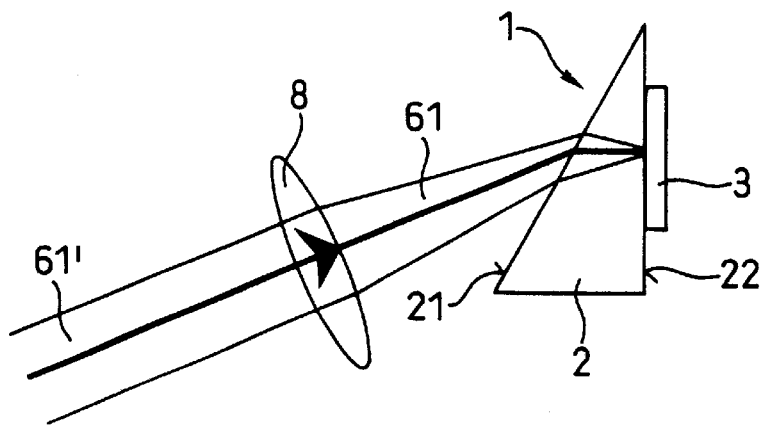
FIG. 14 is a schematic drawing of a BASIC chirped mirror on a half Brewster prism.

FIG. 14 depicts another way of using a half Brewster-prism 2 for use with a beam 61 with high numerical aperture. The beam 61 is focused on to the BASIC coated back surface 22 of the prism 2 with the aid of a lens 8. If the numerical aperture of the input beam 61' is larger than the angular spread of the beam 61 inside the prism 2, spatial chirp of the reflected beam can be neglected. The arrangement of FIG. 14 provides a relatively simple way to combine the advantage of a front Brewster surface 21 with the BASIC coating 3. Again, the back surface 22 can be angled such to provide ideal retroreflection, or, more generally, reflection at an arbitrary angle.

Figure 15:
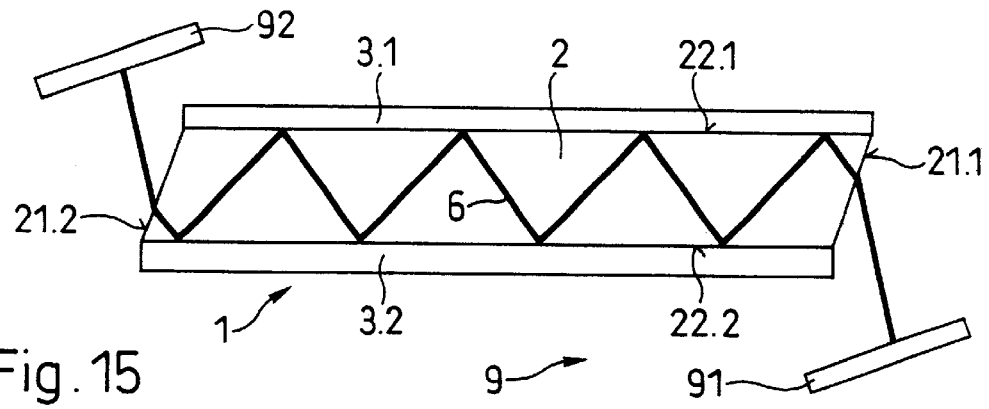
FIG. 15 is a schematic drawing of a BASIC chirped mirror on a wedged substrate.
Figure 16:
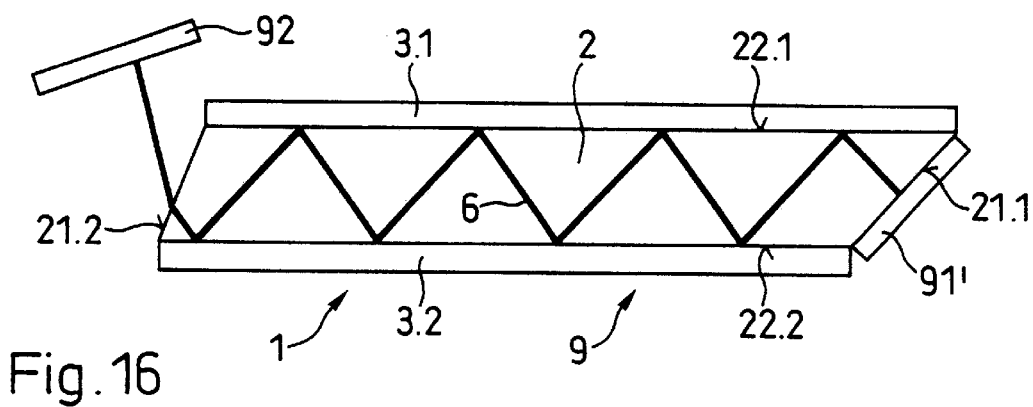
FIGS. 16–17 are schematic drawings of three embodiments of a laser cavity with a laser slab crystal bearing BASIC chirped mirrors on two parallel sides.
Figure 17:
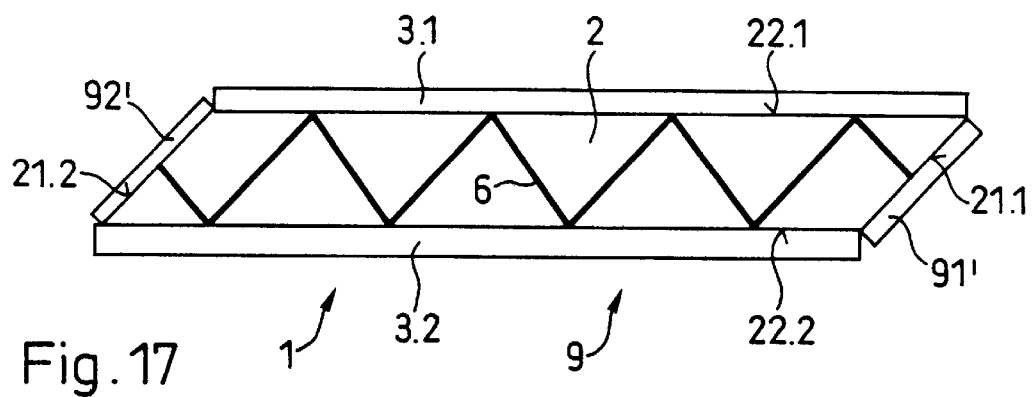

In FIGS. 15–17, several applications of a BASIC coating to achieve ultrabroadband and ultracompact dispersion compensation in a laser is illustrated. The same principles apply for wavguide geometries, which are commonly used in integrated optics. However, these have much smaller dimensions close to the wavelength. We will restrict ourselves to the description of macroscopic structures here. A laser slab crystal or waveguide 2 is coated on two parallel sides 22.1, 22.2 with BASIC coatings 3.1, 3.2. The ray 6 inside the crystal 2 follows a zig-zag geometry. According to FIG. 15, a laser cavity 9 is built using external end mirrors 91, 92. In this case the input and output facets 21.1, 21.2 of the crystal 2 are most suitably Brewster cut to avoid back reflections. More generally, any angle can be used with a suitable antireflection coating. Alternatively, the facets 21.1, 21.2 can also be cut to provide normal incidence. Mirror coatings 91', 92' can be applied to the facets 21.1, 21.2 to provide partial or high reflection, as shown in FIG. 17. In the embodiments of FIGS. 15–17, dispersion compensation in a truly monolithic laser can be achieved. In particular, a semiconductor absorber mirror (not shown) can be coated on one of the facets 21.1 or 21.2, or, alternatively used instead of external mirrors 91 and/or 92. Use of a saturable absorber mirror allows constructing a completely mirror-compensated modelocked laser with ultrahigh repetition rate in the range from 10 to 100 GHz. Other mechanisms to provide mode-locking might be used instead. Combination of the monolithic design of FIG. 17 and the external mirror design of FIG. 15 is depicted in FIG. 16. Ring geometries are also feasible. The laser can be pumped collinear to the beam path or, provided a suitable transmission window of the coatings 3.1 or 3.2, from either of the BASIC coated sides 22.1 or 22.2. In any case, excellent heat sinking of the crystal 2 can be achieved due to the thin disc geometry.

Figure 18:
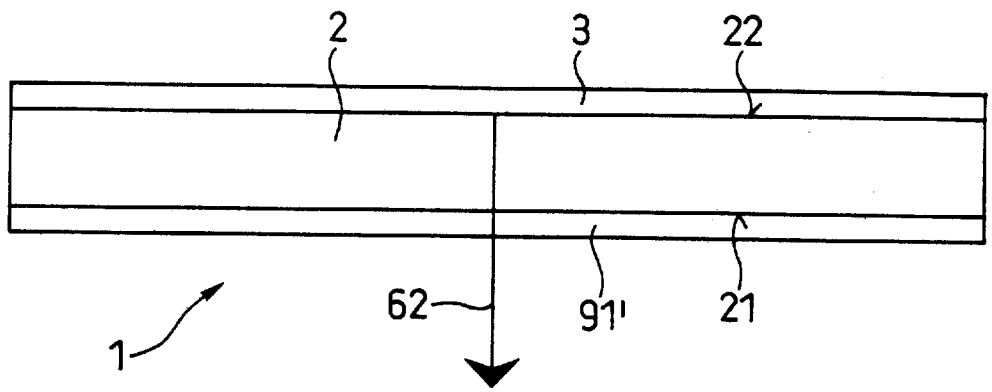
FIGS. 18 and 19 are schematic drawings of two embodiments of a microchip laser bearing BASIC chirped mirrors on two facets.
Figure 19:
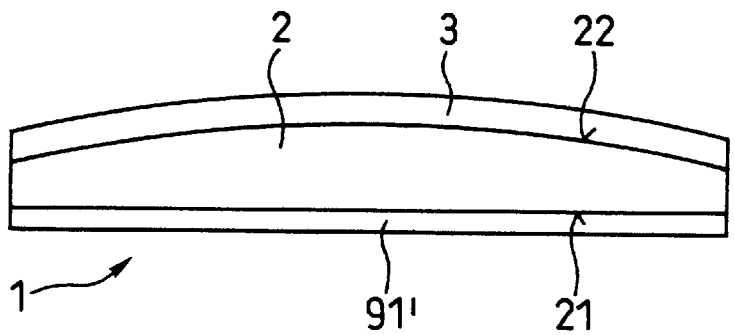

Similar cases for a microchip laser geometry are shown in FIGS. 18 and 19. With such embodiments according to the invention, very compact lasers with very high repetition rates can be realized, e.g., for telecommunication purposes. In the embodiment of FIG. 18, a laser gain material is used for the substrate 2. Either of the coatings on the two facets 21, 22 of the lasing substrate 2 can be a BASIC mirror 3, a semiconductor saturable absorber minor, or an output coupler 91' with partial transmission for laser light 62. Different cases of curvature for both facets 21 and 22 are possible as shown in FIG. 19.

What is claimed is:

1. A dielectric and/or semiconductor device for influencing the dispersion of electromagnetic radiation within a given spectral range, comprising
    a substrate being essentially transparent to said electromagnetic radiation, having a first surface for incoupling said electromagnetic radiation into said substrate and/or for outcoupling said electromagnetic radiation out of said substrate, and a second surface, and
    a reflective multilayer structure adjacent to said second surface, said multilayer structure providing a controlled dispersion characteristic upon reflection of said electromagnetic radiation,
    the structure being arranged in such a way that there is essentially no interference in said substrate of electromagnetic radiation propagating in the direction of said multilayer structure and electromagnetic radiation reflected by said multilayer structure.

2. The device of claim 1, wherein the layers of said multilayer structure have refractive indices which vary between layers of said multilayer structure.

3. The device of claim 2, wherein said multilayer structure includes a chirped mirror.

4. The device of claim 2, wherein said multilayer structure includes a plurality of alternately high-index and low-index dielectric and/or semiconductor layers.

5. The device of claim 4, wherein said substrate has a refractive index essentially equal to that of the high-index layer, to that of the low-index layer or to the geometric average of the refractive indices of the high- and low-index layers.

6. The device of claim 1, wherein said first and second surfaces of the substrate are plain and wedged with respect to each other.

7. The device of claim 1, wherein said first and/or second surface of the substrate is curved and said first and second surfaces have different centers of curvature.

8. The device of claim 1, wherein said first surface of the substrate is provided with an antireflection coating, a semiconductor saturable absorber mirror, or an output coupler with partial transmission.

9. The device of claim 1, wherein said substrate is made of a laser gain material or a waveguide material.

10. The device of claim 9, wherein said substrate has two parallel surfaces, one of them being said second surface, and both parallel surfaces being provided with a reflective multilayer structure.

11. A method for influencing the dispersion of electromagnetic radiation within a given spectral range, comprising the steps of
    allowing said electromagnetic radiation to propagate in a substrate essentially transparent to said electromagnetic radiation;
    reflecting said electromagnetic radiation of a reflective multilayer structure, thus introducing a controlled dispersion characteristic to said electromagnetic radiation; and
    not allowing essentially any interference of electromagnetic radiation propagating in the direction of said multilayer structure and electromagnetic radiation reflected by said multilayer structure.

12. The method of claim 11, wherein said electromagnetic radiation is incoupled into said substrate or is generated in said substrate.

13. The method of claim 12, wherein said electromagnetic radiation is incoupled into said substrate through an antireflection coating.

14. The method of claim 11, wherein said electromagnetic radiation has a given spatial extension and the thickness of said substrate is chosen to be at least ten times the spatial extension of said electromagnetic radiation.

15. The method of claim 11, wherein said electromagnetic radiation is incoupled into said substrate under the Brewster angle.

16. The method of claim 11, wherein said electromagnetic radiation is reflected more than once of a reflective multilayer structure and propagates in said substrate between two such reflections.

* * * * *